(12) United States Patent
Kim et al.

(10) Patent No.: US 11,617,289 B2
(45) Date of Patent: Mar. 28, 2023

(54) DISPLAY DEVICE

(71) Applicant: Samsung Display Co., Ltd., Yongin-si (KR)

(72) Inventors: Keunwoo Kim, Seongnam-si (KR); Doo-Na Kim, Seongnam-si (KR); Meejae Kang, Suwon-si (KR); Thanh Tien Nguyen, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/244,013

(22) Filed: Apr. 29, 2021

(65) Prior Publication Data

US 2021/0391401 A1 Dec. 16, 2021

(30) Foreign Application Priority Data

Jun. 15, 2020 (KR) .......................... 10-2020-0072439

(51) Int. Cl.
*G09G 3/3258* (2016.01)
*G09G 3/3266* (2016.01)

(52) U.S. Cl.
CPC ....... *H10K 59/1213* (2023.02); *G09G 3/3258* (2013.01); *G09G 3/3266* (2013.01); *H10K 59/124* (2023.02)

(58) Field of Classification Search
CPC ............... G09G 3/3233; G09G 3/3291; G09G 2300/0426; G09G 2300/0842; H01L 27/1225; H01L 27/1255; H01L 27/3248; H01L 27/3258; H01L 127/32; H01L 27/326; H01L 27/3262; H01L 27/3265; H01L 27/3276; H01L 27/3282; H01L 2227/323; H01L 28/60; H01L 29/24; H01L 29/4908; H01L 29/4916; H01L 29/66969;

(Continued)

(56) References Cited

U.S. PATENT DOCUMENTS

2006/0038804 A1\* 2/2006 Hayakawa ........... G09G 3/3233
345/204
2006/0208977 A1\* 9/2006 Kimura ................ G09G 3/3233
345/76

(Continued)

FOREIGN PATENT DOCUMENTS

KR 10-2019-0051504 A 5/2019

*Primary Examiner* — Michael J Eurice
(74) *Attorney, Agent, or Firm* — Lewis Roca Rothgerber Christie LLP

(57) ABSTRACT

A display device includes a pixel including a pixel driving transistor and a pixel switching transistor, the pixel driving transistor including a first active layer including a first channel area having a first length, a first gate insulating layer on the first active layer, a first gate electrode on the first gate insulating layer, a first source electrode and a first drain electrode above the first gate electrode, the pixel switching transistor including a second active layer including a second channel area having a second length that is shorter than the first length, a second gate insulating layer on the second active layer, a second gate electrode on the second gate insulating layer, a second source and a second drain electrode above the second gate electrode, and wherein the pixel driving transistor and the pixel switching transistor each include a P-MOS transistor.

20 Claims, 7 Drawing Sheets

(58) Field of Classification Search
CPC ............. H01L 29/786; H01L 29/78618; H01L 29/78648; H01L 151/0097
See application file for complete search history.

(56) References Cited

U.S. PATENT DOCUMENTS

| | | | | |
|---|---|---|---|---|
| 2007/0040786 A1* | 2/2007 | Chung | ................. | G11C 19/184 345/92 |
| 2015/0379923 A1* | 12/2015 | Lee | .................... | H01L 27/3272 345/82 |
| 2018/0342570 A1* | 11/2018 | Hong | ................. | H01L 27/3258 |
| 2018/0366066 A1* | 12/2018 | Kim | ................... | H01L 27/3265 |
| 2019/0229163 A1* | 7/2019 | Murai | ................... | H01L 27/326 |
| 2021/0036079 A1 | 2/2021 | Kim et al. | | |

\* cited by examiner

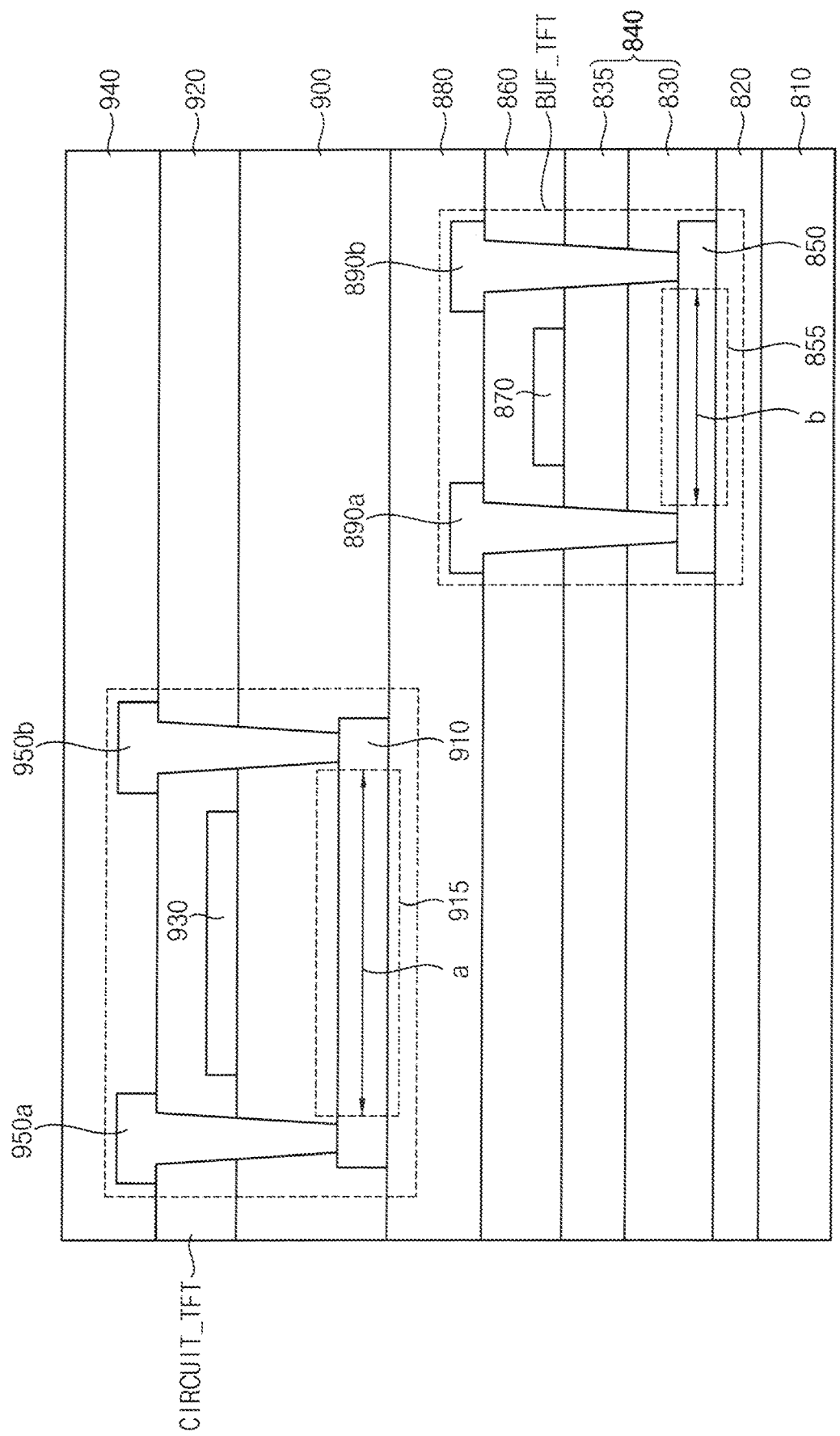

DISPLAY DEVICE

CROSS-REFERENCE TO RELATED APPLICATION

This application claims priority to, and the benefit of, Korean Patent Application No. 10-2020-0072439 filed on Jun. 15, 2020 in the Korean Intellectual Property Office (KIPO), the entire disclosure of which is incorporated herein by reference.

BACKGROUND

1. Field

The present disclosure relates to a display device including a plurality of thin film transistors.

2. Description of the Related Art

As display devices become smaller, efforts to reduce or minimize a bezel area, which is an outer area of a display area, have been made to increase a size of the display area. In general, because lines and driving circuits for driving a display device are located in a bezel area corresponding to a non-display area, there is a limit to the extent to which the bezel area can be reduced or minimized. Accordingly, study is being conducted to reduce the size of the display device by reducing the size of a thin film transistor of the display device.

However, as a driving frequency or resolution of the display device increases, it may be difficult to secure a driving voltage of the thin film transistor, and a time to charge the thin film transistor may be shortened.

SUMMARY

Embodiments provide a display device with improved display quality.

A display device according to embodiments may include a pixel including a pixel driving transistor and a pixel switching transistor, wherein the pixel driving transistor includes a first active layer doped with a group 3 element, and including a first channel area having a first length, a first gate insulating layer on the first active layer, a first gate electrode on the first gate insulating layer, a first source electrode above the first gate electrode, and connected to a source area of the first active layer, and a first drain electrode above the first gate electrode, and connected to a drain area of the first active layer, wherein the pixel switching transistor includes a second active layer doped with a group 5 element, and including a second channel area having a second length that is shorter than the first length, a second gate insulating layer on the second active layer, a second gate electrode on the second gate insulating layer, a second source electrode above the second gate electrode, and connected to a source area of the second active layer, and a second drain electrode above the second gate electrode, and connected to a drain area of the second active layer, and wherein the pixel driving transistor and the pixel switching transistor each include a P-MOS transistor.

The first gate insulating layer and the second gate insulating layer may be on a same layer, wherein the first gate insulating layer is a single layer including a silicon oxide-based material, and wherein the second gate insulating layer is a multilayer including a 2-1 gate insulating layer including the silicon oxide-based material, and a 2-2 gate insulating layer on the 2-1 gate insulating layer and including a silicon nitride-based material.

The first length may be about 10 um to about 30 um, wherein the second length is about 1 um to about 5 um.

The pixel may further include a capacitance electrode on the first gate electrode, and below the first source electrode and the first drain electrode.

The pixel may further include an organic light emitting diode, and wherein the organic light emitting diode includes a lower electrode connected to the first drain electrode, an intermediate layer on the lower electrode, and an upper electrode on the intermediate layer.

A display device may further include a scan driver for providing a scan signal to the pixel, and including a scan buffer transistor and a scan circuit transistor, wherein the scan circuit transistor includes a third active layer doped with a group 3 element, and including a third channel area having the first length, a third gate insulating layer on the third active layer, a third gate electrode on the third gate insulating layer, a third source electrode above the third gate electrode, and connected to a source area of the third active layer, and a third drain electrode above the third gate electrode, and connected to a drain area of the third active layer, and wherein the scan buffer transistor including a fourth active layer doped with a group 5 element, and including a fourth channel area having the second length, a fourth gate insulating layer on the fourth active layer, a fourth gate electrode on the fourth gate insulating layer, a fourth source electrode above the fourth gate electrode, and connected to a source area of the fourth active layer, and a fourth drain electrode above the fourth gate electrode, and connected to a drain area of the fourth active layer.

The third gate insulating layer may be a single layer including a silicon oxide-based material, wherein the fourth gate insulating layer is a multilayer including a 4-1 gate insulating layer including the silicon oxide-based material, and a 4-2 gate insulating layer on the 4-1 gate insulating layer and including a silicon nitride-based material.

The scan buffer transistor may be connected to a scan signal output part of the scan driver.

The scan circuit transistor may be on the scan buffer transistor.

The display device may further include a light emitting driver for providing a light emitting control signal to the pixel, and including a light emitting buffer transistor and a light emitting circuit transistor, wherein the light emitting circuit transistor including a fifth active layer doped with a group 3 element, and including a fifth channel area having the first length, a fifth gate insulating layer on the fifth active layer, a fifth gate electrode on the fifth gate insulating layer, a fifth source electrode above the fifth gate electrode, and connected to a source area of the fifth active layer, and a fifth drain electrode above the fifth gate electrode, and connected to a drain area of the fifth active layer, and wherein the light emitting buffer transistor including a sixth active layer doped with a group 5 element, and including a sixth channel area having the second length, a sixth gate insulating layer on the sixth active layer, a sixth gate electrode on the sixth gate insulating layer, a sixth source electrode above the sixth gate electrode, and connected to a source area of the sixth active layer, and a sixth drain electrode above the sixth gate electrode, and connected to a drain area of the sixth active layer.

The fifth gate insulating layer may be a single layer including a silicon oxide-based material, wherein the sixth gate insulating layer is a multilayer including a 6-1 gate insulating layer including the silicon oxide-based material, and a 6-2 gate insulating layer on the 6-1 gate insulating layer and including a silicon nitride-based material.

The light emitting buffer transistor may be connected to a light emitting control signal output part of a scan driver.

The light emitting circuit transistor may be on the light emitting buffer transistor.

The pixel switching transistor may be on the pixel driving transistor.

The first gate insulating layer may be a single layer including a silicon oxide-based material, wherein the second gate insulating layer is a multilayer including a 2-1 gate insulating layer including the silicon oxide-based material, and a 2-2 gate insulating layer on the 2-1 gate insulating layer and including a silicon nitride-based material.

The pixel may further include an organic light emitting diode, wherein the organic light emitting diode including a lower electrode connected to the first drain electrode, an intermediate layer on the lower electrode, and an upper electrode on the intermediate layer.

The pixel driving transistor may further include a connection electrode between the first gate electrode and the first drain electrode, wherein the connection electrode connects the first drain electrode and the drain area of the first active layer.

The connection electrode may overlap the first gate electrode.

An area of the pixel driving transistor and the pixel switching transistor may overlap.

A display device according to embodiments of the present disclosure may include a pixel driving transistor including and a pixel switching transistor, wherein the pixel driving transistor including a first active layer doped with a group 5 element, and including a first channel area having a first length, a first gate insulating layer on the first active layer, a first gate electrode on the first gate insulating layer, a first source electrode above the first gate electrode, and connected to a source area of the first active layer, and a first drain electrode above the first gate electrode, and connected to a drain area of the first active layer, wherein the pixel switching transistor including a second active layer doped with a group 3 element, and including a second channel area having a second length shorter than the first length, a second gate insulating layer on the second active layer, a second gate electrode on the second gate insulating layer, a second source electrode above the second gate electrode, and connected to a source area of the second active layer, and a second drain electrode above the second gate electrode, and connected to a drain area of the second active layer, and wherein the pixel driving transistor and the pixel switching transistor are N-MOS transistor.

Accordingly, it is possible to secure a wide range of driving voltages of the pixel driving transistors that drive the pixels, secure the charging time of the pixel switching transistor, and slow down the reaction time taken when turning on/off.

BRIEF DESCRIPTION OF THE DRAWINGS

Illustrative, non-limiting embodiments will be more clearly understood from the following detailed description taken in conjunction with the accompanying drawings.

FIG. 7 is a cross-sectional view illustrating some embodiments of transistors located in a scan driver and a light emitting driver of FIG. 1.

DETAILED DESCRIPTION

Figure 1:
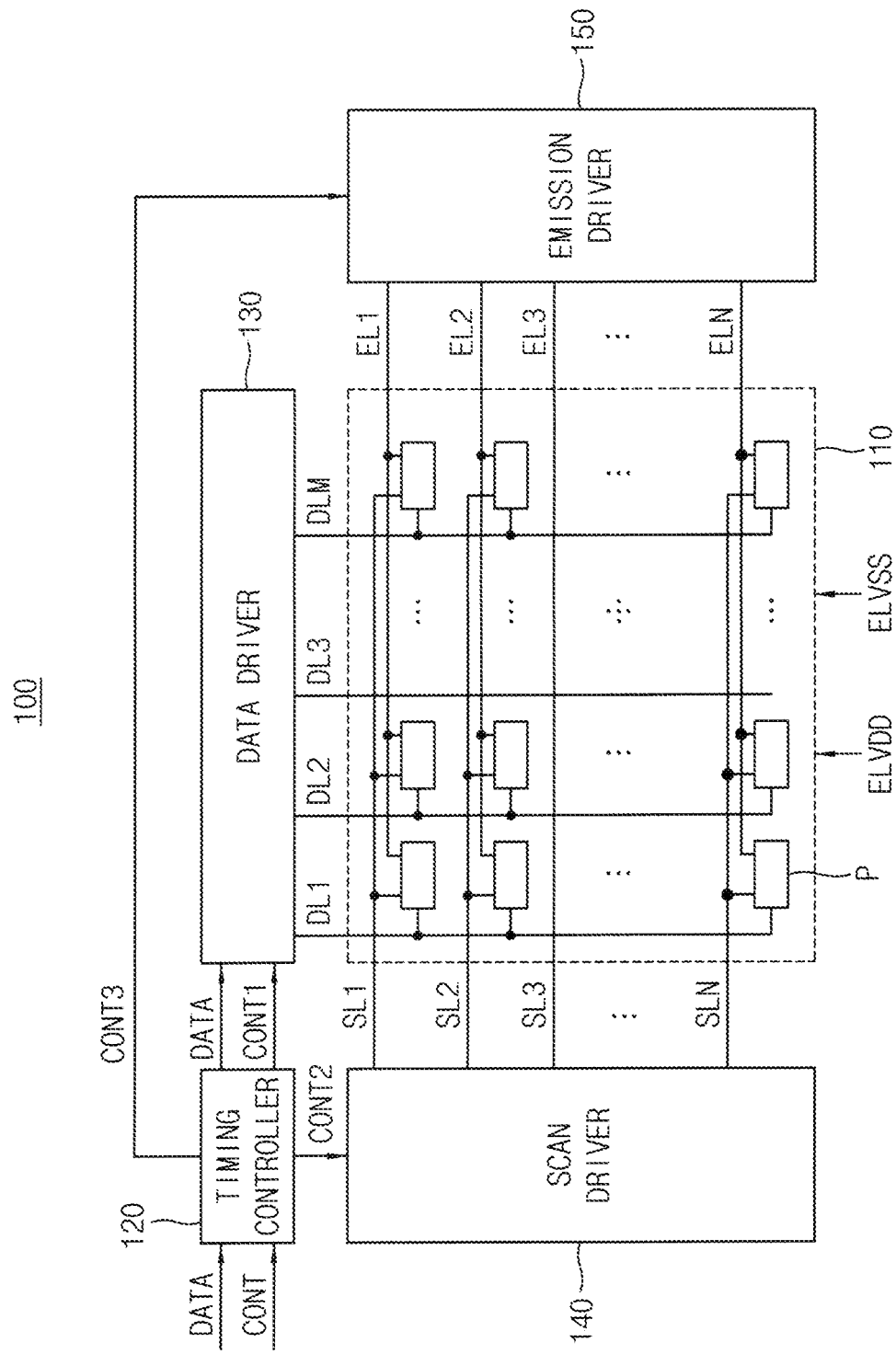
FIG. 1 is a block diagram illustrating a display device according to embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device according to embodiments.

Referring to FIG. 1, The display device 100 may include a display part 110, a timing controller 120, a data driver 130, a scan driver 140, and a light emitting driver/emission driver 150. The display part 110 may include a plurality of pixels P. The plurality of pixels P may be connected to a plurality of scan lines SL1, . . . , SLN, a plurality of data lines DL1, . . . , DLM, and a plurality of light emitting control lines EL1, . . . , ELN, N and M being natural numbers.

The data lines DL1, . . . , DLM are connected to the data driver 130 to transmit a data voltage to the pixels P. The scan lines SL1, . . . , SLN may be connected to the scan driver 140 to transmit a scan signal to the pixels P. The light emitting control lines EL1, . . . , ELN may be connected to the light emitting driver 150 to transmit light emitting control signals to the pixels P.

The pixels P may receive a first power voltage ELVDD and a second power voltage ELVSS. The pixels P may receive the data voltage in response to the scan signal. The pixels P may generate light of a gray scale corresponding to the data voltage using the first power voltage ELVDD and the second power voltage ELVSS.

The timing controller 120 may receive a data signal DATA and a control signal CONT from an external device. In embodiments, the data signal DATA may include red, green, and blue image data. The control signal CONT may include a horizontal synchronization signal, a vertical synchronization signal, and a main clock signal.

The timing controller 120 may convert the data signal DATA based on specifications such as a pixel structure and resolution of the display part 110, and may output it to the data driver 130.

The timing controller 120 may produce a first control signal CONT1 for driving the data driver 130, a second control signal CONT2 for driving the scan driver 140, and a third control signal CONT3 for driving the light emitting driver 150 based on the control signal CONT.

The data driver 130 may convert the data signal DATA to the data voltage in response to the first control signal CONT1, and may output the data voltage to the data lines DL1, . . . , DLM.

The scan driver 140 may generate a plurality of scan signals in response to the second control signal CONT2. The light emitting driver 150 may generate a plurality of light emitting control signals in response to the third control signal CONT3.

Figure 2:
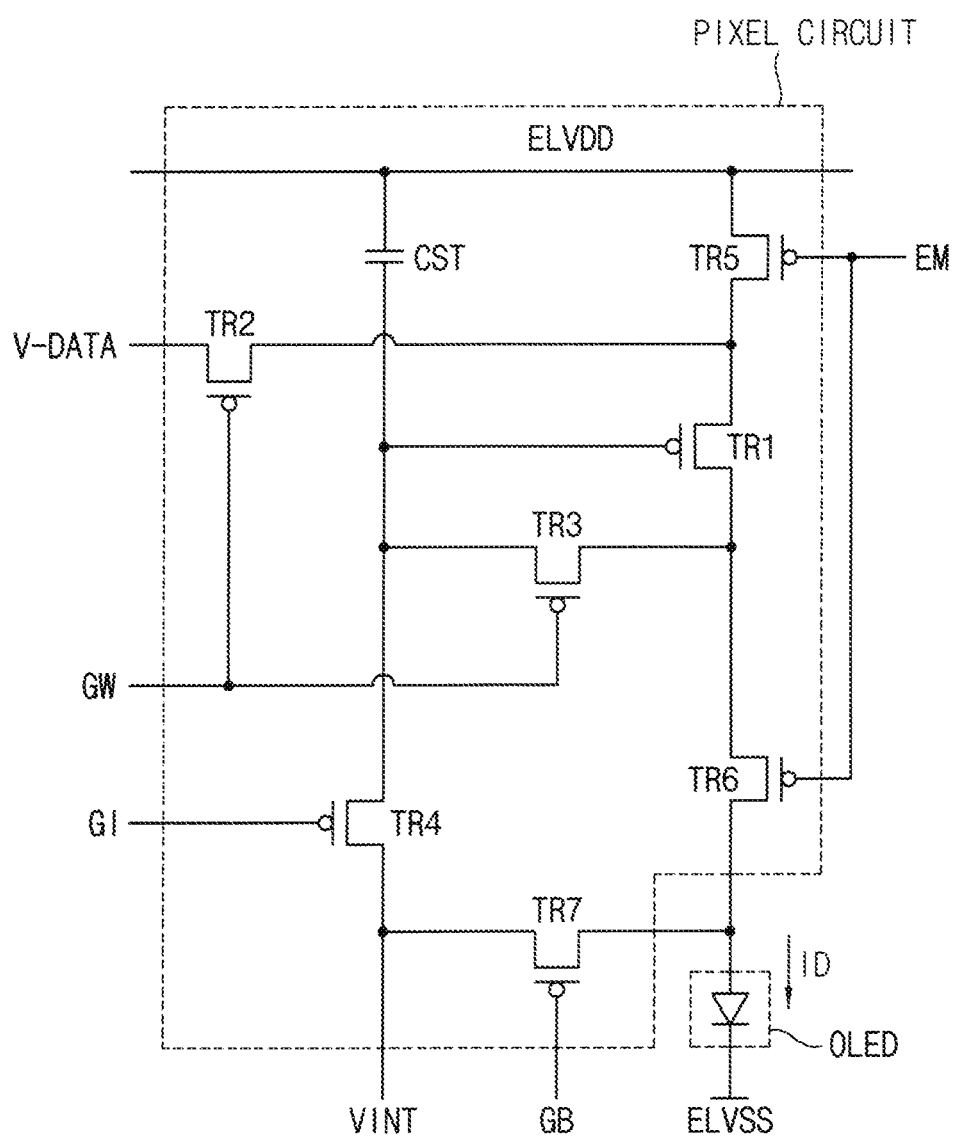
FIG. 2 is a circuit diagram illustrating a pixel circuit and an organic light emitting diode included in a pixel of FIG. 1.

FIG. 2 is a circuit diagram illustrating a pixel circuit and an organic light emitting diode included in a pixel of FIG. 1.

Referring to FIGS. 1 and 2, each of the pixels P may include a pixel circuit and an organic light emitting diode OLED. The pixel circuit may include first to seventh transistors TR1, TR2, TR3, TR4, TR5, TR6, TR7, a storage capacitor CST, a first power voltage line, a second power voltage line, a initialization voltage line, a data signal line, a scan signal line, a data initialization signal line, a light emitting control signal line, and a diode initialization signal line. The pixel circuit may be connected to the organic light emitting diode OLED.

The organic light emitting diode OLED may output light based on a driving current ID. The organic light emitting diode OLED may include a first terminal and a second terminal. In embodiments, the second terminal of the organic light emitting diode OLED may receive a second power voltage ELVSS. For example, the first terminal of the organic light emitting diode OLED may be an anode terminal, and the second terminal of the organic light emitting diode OLED may be a cathode terminal. Optionally, the first terminal of the organic light emitting diode OLED may be a cathode terminal, and the second terminal of the organic light emitting diode OLED may be an anode terminal.

The first transistor TR1 may include a gate terminal, a first terminal, and a second terminal. In embodiments, the first terminal of the first transistor TR1 may be a source terminal, and the second terminal of the first transistor TR1 may be a drain terminal. Optionally, the first terminal of the first transistor TR1 may be a drain terminal, and the second terminal of the first transistor TR1 may be a source terminal. The same may be applied to the second to seventh transistors TR2, TR3, TR4, TR4, TR5, TR6, TR7 to be described below. Therefore, a description related to this will be omitted below.

The first transistor TR1 may generate a driving current ID. In embodiments, the first transistor TR1 may be defined as a pixel driving transistor for driving a pixel. The first transistor TR1 may generate the driving current ID based on a voltage difference between the gate terminal and the source terminal. Further, a gray scale may be expressed in the pixels P based on the magnitude of the driving current ID supplied to the organic light emitting diode OLED.

The second transistor TR2 may include a gate terminal, a first terminal, and a second terminal. The gate terminal of the second transistor TR2 may receive a scan signal GW. The first terminal of the second transistor TR2 may receive a data voltage V_DATA. The second terminal of the second transistor TR2 may be connected to the first terminal of the first transistor TR1.

The second transistor TR2 may supply the data voltage V_DATA to the first terminal of the first transistor TR1 during an activation period of the scan signal GW.

The third transistor TR3 may include a gate terminal, a first terminal, and a second terminal. The gate terminal of the third transistor TR3 may receive the scan signal GW. The first terminal of the third transistor TR3 may be connected to the gate terminal of the first transistor TR1. The second terminal of the third transistor TR3 may be connected to the second terminal of the first transistor TR1.

The third transistor TR3 may connect the gate terminal of the first transistor TR1 and the second terminal of the first transistor TR1 during an activation period of the scan signal GW. The third transistor TR3 may diode-connect the first transistor TR1 during an activation period of the scan signal GW. Because the first transistor TR1 is diode-connected, a voltage difference equal to a threshold voltage of the first transistor TR1 may occur between the first terminal of the first transistor TR1 and the gate terminal of the first transistor TR1. As a result, during the activation period of the scan signal GW, a voltage summed up by the voltage difference (e.g., threshold voltage) to the data voltage V_DATA supplied to the first terminal of the first transistor TR1 may be supplied to the gate terminal of the first transistor TR1. That is, the data voltage V_DATA may be compensated by the threshold voltage of the first transistor TR1, and the compensated data voltage V_DATA may be supplied to the gate terminal of the first transistor TR1.

The fourth transistor TR4 may include a gate terminal, a first terminal, and a second terminal. Here, the gate terminal of the fourth transistor TR4 may receive a data initialization signal GI. The first terminal of the fourth transistor TR4 may receive the initialization voltage VINT. The second terminal of the fourth transistor TR4 may be connected to the gate terminal of the first transistor TR1.

The fourth transistor TR4 may supply the initialization voltage VINT to the gate terminal of the first transistor TR1 during an activation period of the data initialization signal GI. That is, the fourth transistor TR4 may initialize the gate terminal of the first transistor TR1 using the initialization voltage VINT during an activation period of the data initialization signal GI.

The fifth transistor TR5 may supply the first power voltage ELVDD to the first terminal of the first transistor TR1 during an activation period of the light emitting control signal EM. Conversely, the fifth transistor TR5 may cut off the supply of the first power voltage ELVDD during an inactive period of the light emitting control signal EM. When the fifth transistor TR5 supplies the first power voltage ELVDD to the first terminal of the first transistor TR1 during an activation period of the light emitting control signal EM, the first transistor TR1 may generate the driving current ID. In addition, when the fifth transistor TR5 blocks the supply of the first power voltage ELVDD during an inactive period of the light emitting control signal EM, the data voltage V_DATA that is supplied to the first terminal of the second transistor TR2 may be supplied to the gate terminal of the first transistor TR1.

The sixth transistor TR6 may include a gate terminal, a first terminal, and a second terminal. The gate terminal of the sixth transistor TR6 may receive the light emitting control signal EM. The first terminal of the sixth transistor TR6 may be connected to the second terminal of the first transistor TR1. The second terminal of the sixth transistor TR6 may be connected to the first terminal of the organic light emitting diode OLED.

The sixth transistor TR6 may supply the driving current ID to the organic light emitting diode OLED during an activation period of the light emitting control signal EM. The sixth transistor TR6 supplies the driving current ID to the organic light emitting diode OLED during an activation period of the light emitting control signal EM, so that the organic light emitting diode OLED may output light. In addition, the sixth transistor TR6 may electrically separate the first transistor TR1 and the organic light emitting diode OLED from each other during an inactive period of the light emitting control signal EM. Accordingly, the data voltage V_DATA supplied to the second terminal of the first transistor TR1 may be supplied to the gate terminal of the first transistor TR1.

The seventh transistor TR7 may include a gate terminal, a first terminal, and a second terminal. The gate terminal of the seventh transistor TR7 may receive a diode initialization signal GB. The first terminal of the seventh transistor TR7 may receive the initialization voltage VINT. The second terminal of the seventh transistor TR7 may be connected to the first terminal of the organic light emitting diode OLED.

The seventh transistor TR7 may supply the initialization voltage VINT to the first terminal of the organic light emitting diode OLED during an activation period of the diode initialization signal GB. The seventh transistor TR7 may initialize the first terminal of the organic light emitting diode OLED to the initialization voltage VINT during an activation period of the diode initialization signal GB.

The storage capacitor CST may include a first terminal and a second terminal. The storage capacitor CST may be connected between the first power voltage line and the gate terminal of the first transistor TR1. For example, a first terminal of the storage capacitor CST may be connected to a gate terminal of the first transistor TR1, and a second terminal of the storage capacitor CST may be connected to the first power voltage line. The storage capacitor CST may maintain a voltage level of the gate terminal of the first transistor TR1 during an inactive period of the scan signal GW. The inactive period of the scan signal GW may include, or may occur during, an activation period of the light emitting control signal EM. During the activation period of the light emitting control signal EM, the driving current ID may be supplied to the organic light emitting diode OLED. Accordingly, the driving current ID may be supplied to the organic light emitting diode OLED based on the voltage level maintained by the storage capacitor CST.

In embodiments, the second to seventh transistors TR2, TR3, TR4, TR5, TR6, and TR7 may be defined as pixel switching transistors.

Figure 3:
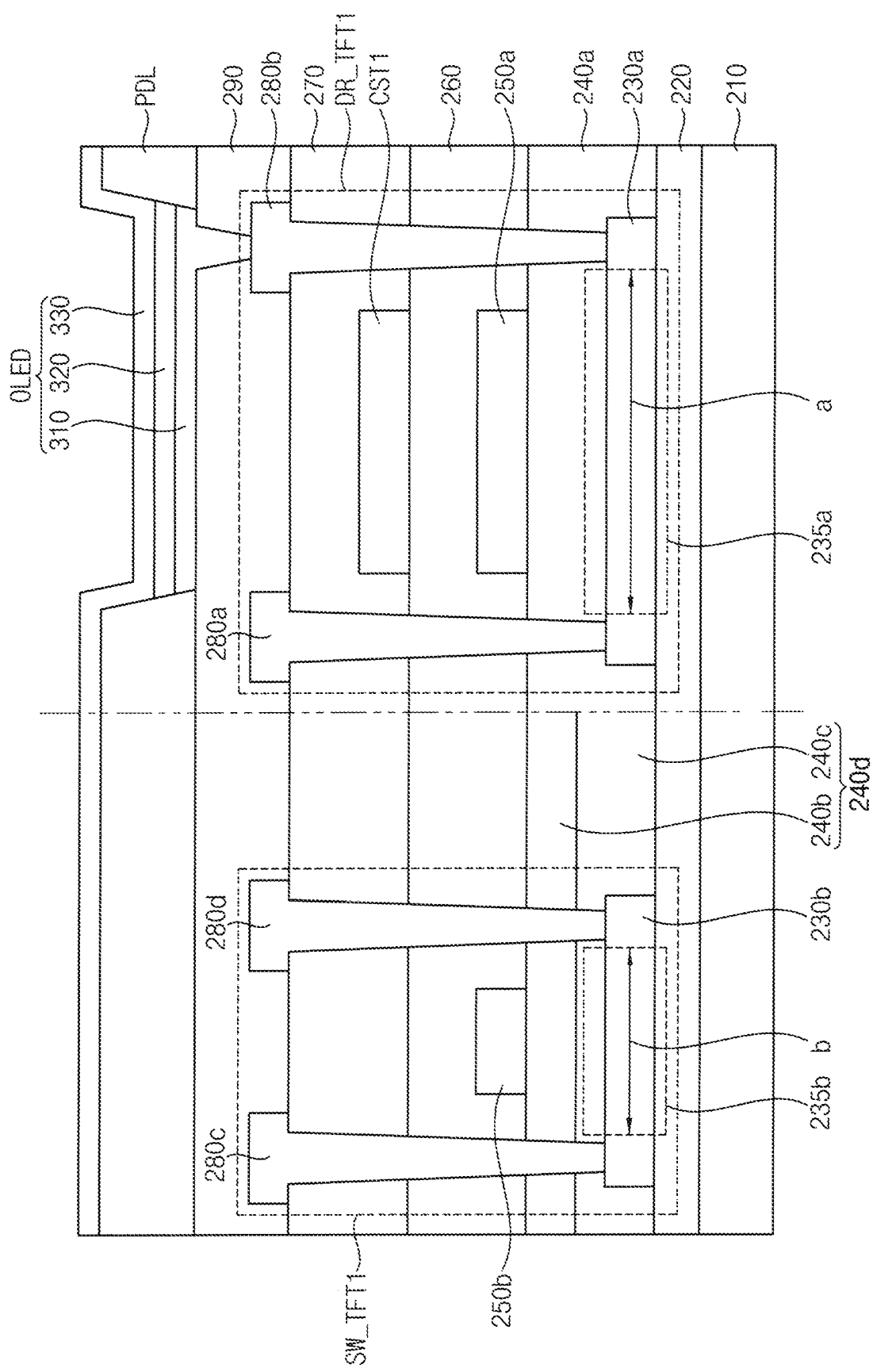
FIG. 3 is a cross-sectional view illustrating some embodiments of transistors located in the display device of FIG. 1.

FIG. 3 is a cross-sectional view illustrating some embodiments of transistors located in the display device of FIG. 1.

Referring to FIGS. 1 and 3, the display device 100 may include a substrate 210, a buffer layer 220, a capacitance electrode CST1, a first interlayer insulating layer 260, a second interlayer insulating layer 270, a via insulating layer 290, a first pixel driving transistor DR_TFT1, a first pixel switching transistor SW_TFT1, a pixel defining layer PDL, and an organic light emitting diode OLED.

The first pixel driving transistor DR_TFT1 may include a first active layer 230a, a first gate insulating layer 240a, a first gate electrode 250a, a first source electrode 280a, and a first drain electrode 280b. In embodiments, the first pixel driving transistor DR_TFT1 may correspond to the first transistor TR1 of FIG. 2.

The first pixel switching transistor SW_TFT1 may include a second active layer 230b, a second gate insulating layer 240d, a second gate electrode 250b, a second source electrode 280c, and a second drain electrode 280d. Here, the second gate insulating layer 240d may be a multilayer including a 2-1 gate insulating layer 240c, and a 2-2 gate insulating layer 240d. In embodiments, the first pixel switching transistor SW_TFT1 may correspond to the transistors TR2, TR3, TR3, TR4, TR5, TR6, TR7 of FIG. 2.

The substrate 210 may include a transparent or opaque material. For example, the substrate 210 may include a quartz substrate, a synthetic quartz substrate, a calcium fluoride substrate, a fluorine-doped quartz substrate, a soda lime glass substrate, an alkali-free glass substrate, and/or the like. Optionally, the substrate 210 may be formed of a flexible transparent resin substrate.

The buffer layer 220 may be located on the substrate 210. The buffer layer 220 may reduce or prevent the diffusion of metal atoms or impurities from the substrate 210 to the transistors DR_TFT1 and SW_TFT1.

The first active layer 230a and the second active layer 230b may be located on the buffer layer 220. The first active layer 230a and the second active layer 230b may include an inorganic semiconductor (e.g., polysilicon, etc.). The first active layer 230a may include a first channel area 235a having a first length "a". In embodiments, the first length "a" may be about 10 um to about 30 um. The second active layer 230b may include a second channel area 235b having a second length "b" that is shorter than the first length "a". In embodiments, the second length "b" may be about 1 um to about 5 um. The first channel area 235a may have the first length "a" to be relatively longer than the second length "b", to secure a driving voltage and improve afterimages. The second channel area 235b may have the second length "b" to be relatively shorter than the first length "a" to reduce charging time.

In embodiments, the first channel area 235a may be doped with a group 3 element. For example, the group 3 element may include boron (B), aluminum (Al), gallium (Ga), indium (In), and the like. When the first pixel driving transistor DR_TFT1 is a PMOS transistor, the first channel area 235a may be doped with the group 3 element. In embodiments, when the first pixel driving transistor DR_TFT1 is an NMOS transistor, the first channel area 235a may be doped with a group 5 element. In embodiments, the second channel area 235b may be doped with a group 5 element. For example, the group 5 element may include nitrogen (N), phosphorus (P), arsenic (As), and the like. When the first pixel switching transistor SW_TFT1 is a PMOS transistor, the second channel area 235b may be doped with the group 5 element. In embodiments, when the first pixel switching transistor SW_TFT1 is an NMOS transistor, the second channel area 235b may be doped with the group 3 element.

The first pixel driving transistor DR_TFT1 and the first pixel switching transistor SW_TFT1 may have different driving ranges. For example, the driving range of the first pixel driving transistor DR_TFT1 may be about 3 V to about 3.5 V. A driving range of the first pixel switching transistor SW_TFT1 may be narrower than a driving range of the first pixel driving transistor DR_TFT1. As the second channel area 235b is doped with the group 5 element, a reaction time taken when the first pixel switching transistor SW_TFT1 is turned on/off may be delayed.

The first gate insulating layer 240a may be located on the buffer layer 220 while covering the first active layer 230a. The first gate insulating layer 240a may be a single layer including silicon oxide (SiOx).

The second gate insulating layer 240d may be located on the buffer layer 220 while covering the second active layer 230b. The 2-1 gate insulating layer 240c may be located on the buffer layer 220. The 2-1 gate insulating layer 240c may be a single layer including silicon oxide (SiOx). The 2-2 gate insulating layer 240b may be located on the 2-1 gate insulating layer 240c. The 2-2 gate insulating layer 240b may be a single layer including silicon nitride (SiNx).

In embodiments, the first gate insulating layer 240a and the second gate insulating layer 240d may be located on the same layer. In addition, the first gate insulating layer 240a and the second gate insulating layer 240d may have the same thickness. As the first pixel switching transistor SW_TFT1 has the relatively short second length "b", it is relatively highly influenced by the signal flowing through the second source electrode 280c and the second drain electrode 280d. However, as the second gate insulating layer 240d has a multilayer structure including the silicon oxide (SiOx) and the silicon nitride (SiNx), the second gate insulating layer 240d may have a lower dielectric constant than a single layer including the silicon oxide (SiOx). Accordingly, the second gate electrode 250b may be affected more than the second source electrode 280c and the second drain electrode 280d.

The first gate electrode 250a may be located on the first gate insulating layer 240a. The first gate electrode 250a may overlap the first active layer 230a. The second gate electrode 250b may be located on the second gate insulating layer 240d. The second gate electrode 250b may overlap the second active layer 230b. The first and second gate electrodes 250a and 250b may include a metal, an alloy, a metal nitride, a conductive metal oxide, a transparent conductive material, and the like.

The first interlayer insulating layer 260 may cover the first gate electrode 250a on the first gate insulating layer 240a and the second gate electrode 250b on the second gate insulating layer 240d. The first interlayer insulating layer 260 may include a silicon compound, a metal oxide, or the like.

The capacitance electrode CST1 may be located on the first interlayer insulating layer 260. The capacitance electrode CST1 may overlap the first gate electrode 250a. The capacitance electrode CST1 may include a metal, an alloy, a metal nitride, a conductive metal oxide, a transparent conductive material, and the like.

The second interlayer insulating layer 270 may be located on the first interlayer insulating layer 260 to cover the capacitance electrode CST1. The second interlayer insulating layer 270 may include a silicon compound, a metal oxide, or the like.

The first source electrode 280a, the first drain electrode 280b, the second source electrode 280c, and the second drain electrode 280d may be located on the second interlayer insulating layer 270. The first source electrode 280a and the first drain electrode 280b may be connected to a source area and a drain area of the first active layer 230a through contact holes, respectively. The second source electrode 280c and the second drain electrode 280d may be connected to a source area of the second active layer 230b and a drain area of the second active layer 230b through contact holes, respectively. The first source electrode 280a, the first drain electrode 280b, the second source electrode 280c, and the second drain electrode 280d may include metal, alloy, metal nitride, conductive metal oxide, transparent conductive material, and the like.

The via insulating layer 290 may be located on the second interlayer insulating layer 270 covering the first source electrode 280a, the first drain electrode 280b, the second source electrode 280c, and the second drain electrode 280d. The via insulating layer 290 may include an organic material or an inorganic material.

The lower electrode 310 may be located on the via insulating layer 290. The lower electrode 310 may be connected to the first drain electrode 280b through a contact hole. In embodiments, the lower electrode 310 may be an anode electrode.

Optionally, the lower electrode 310 may be a cathode electrode. The lower electrode 310 may include a metal, an alloy, a metal nitride, a conductive metal oxide, a transparent conductive material, and/or the like.

The pixel defining layer PDL may be located on the via insulating layer 290. The pixel defining layer PDL may have an opening exposing an upper surface of the lower electrode 310. The pixel defining layer PDL may be made of an organic material or an inorganic material.

The intermediate layer 320 may be located on the lower electrode 310 exposed by the pixel defining layer PDL. The intermediate layer 320 may include at least one selected from a hole injection layer, a hole transport layer, a light emitting layer, an electron transport layer and an electron injection layer.

The upper electrode 330 may be located on the intermediate layer 320 and the pixel defining layer PDL. The upper electrode 330 may cover the intermediate layer 320 and the pixel defining layer PDL, and may be entirely located on the substrate 210. In embodiments, the upper electrode 330 may be a cathode electrode. Optionally, the upper electrode 330 may be an anode electrode. The upper electrode 330 may include a metal, an alloy, a metal nitride, a conductive metal oxide, a transparent conductive material, and the like.

Figure 4:
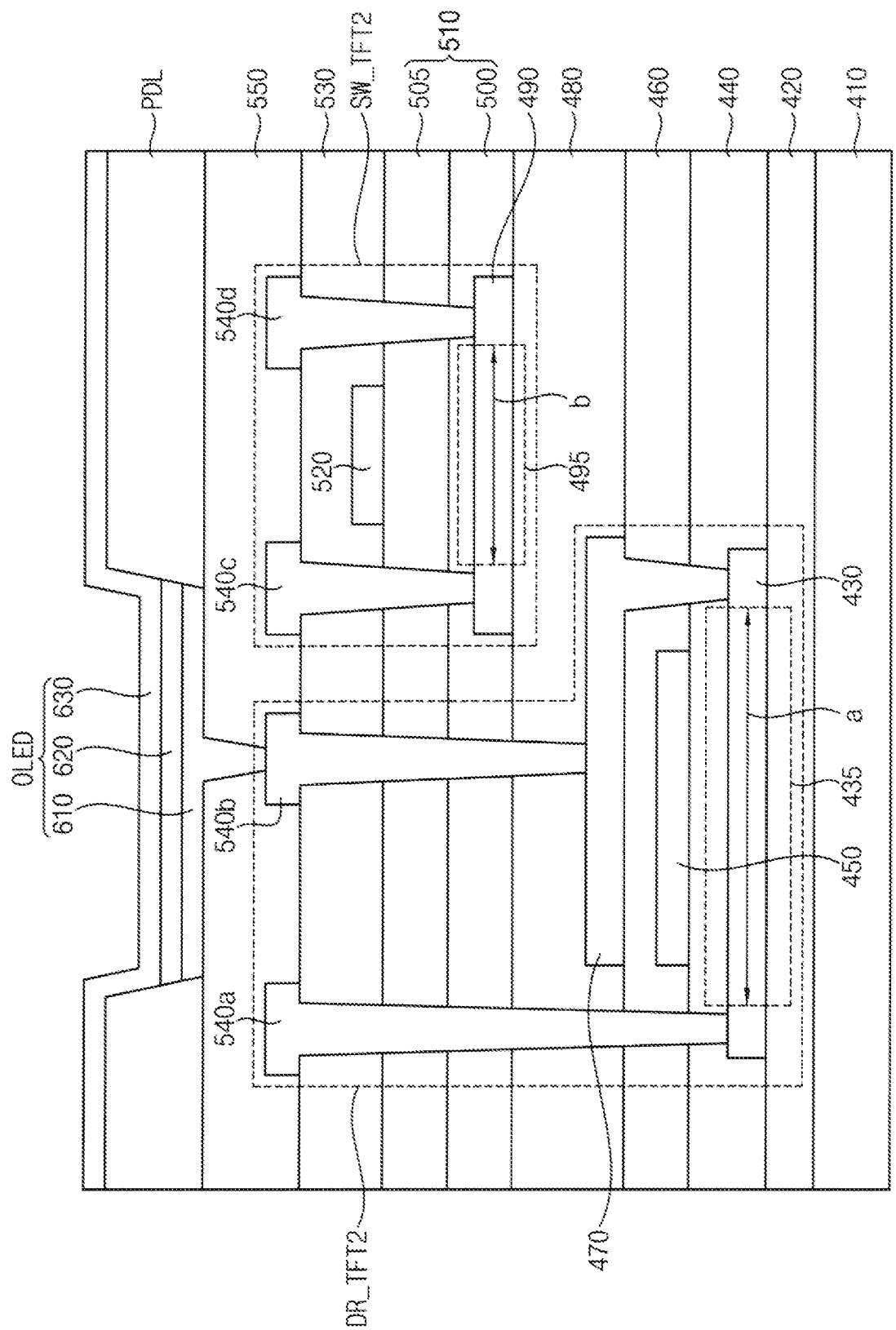
FIG. 4 is a cross-sectional view illustrating some embodiments of transistors located in the display unit of FIG. 1.

FIG. 4 is a cross-sectional view illustrating some embodiments of transistors located in the display unit of FIG. 1.

Referring to FIGS. 1 and 4, the display device 100 may include a substrate 410, a buffer layer 420, a first interlayer insulating layer 460, a second interlayer insulating layer 480, a third interlayer insulating layer 530, a via insulating layer 550, a second pixel driving transistor DR_TFT2, a second pixel switching transistor SW_TFT2, a pixel defining layer PDL, and an organic light emitting diode OLED.

The second pixel driving transistor DR_TFT2 may include a first active layer 430, a first gate insulating layer 440, a first gate electrode 450, a connecting electrode 470, a first source electrode 540a, and a first drain electrode 540b. The second pixel driving transistor DR_TFT2 may correspond to the first transistor TR1 of FIG. 2.

The second pixel switching transistor SW_TFT2 may include a second active layer 490, a second gate insulating layer 510, a second gate electrode 520, a second source electrode 540c, and a second drain electrode 540d. Here, the second gate insulating layer 510 may include a 2-1 gate insulating layer 500 and a 2-2 gate insulating layer 505. The second pixel switching transistor SW_TFT2 may correspond to the second to seventh transistors TR2, TR3, TR4, TR5, TR6, TR7 of FIG. 2.

The substrate 410 may include a transparent or opaque material. For example, the substrate 410 may include a quartz substrate, a synthetic quartz substrate, a calcium fluoride substrate, a fluorine-doped quartz substrate, a soda lime glass substrate, an alkali-free glass substrate, and/or the like. Optionally, the substrate 410 may be formed of a flexible transparent resin substrate.

The buffer layer 420 may be located on the substrate 410. The buffer layer 420 may reduce or prevent diffusion of metal atoms or impurities from the substrate 410 to the transistors DR_TFT2 and SW_TFT2.

The first active layer 430 may be located on the buffer layer 420. The first active layer 430 may include an inorganic semiconductor (e.g., polysilicon, etc.). The first active layer 430 may include a first channel area 435 having a first length "a". In embodiments, the first channel area 435 may be doped with a group 3 element. When the second pixel driving transistor DR_TFT2 is a PMOS transistor, the first channel area 435 may be doped with the group 3 element. In embodiments, when the second pixel driving transistor DR_TFT2 is an NMOS transistor, the first channel area 435 may be doped with a group 5 element.

The first gate insulating layer 440 may be located on the buffer layer 420 covering the first active layer 430. The first gate insulating layer may be a single layer including silicon oxide (SiOx).

The first gate electrode 450 may be located on the first gate insulating layer 440. The first gate electrode 450 may overlap the first active layer 430. The first gate electrode 450 may include a metal, an alloy, a metal nitride, a conductive metal oxide, a transparent conductive material, or the like.

The first interlayer insulating layer 460 covering the first gate electrode 450 may be located on the first gate insulating layer 440. The first interlayer insulating layer 460 may include a silicon compound, a metal oxide, or the like.

The connecting electrode 470 may be located on the first interlayer insulating layer 460. The connecting electrode 470 may overlap the first gate electrode 450. The connecting electrode 470 may be connected to a drain region of the first active layer 430. The connecting electrode 470 may include a metal, an alloy, a metal nitride, a conductive metal oxide, a transparent conductive material, or the like.

The second interlayer insulating layer 480 covering the connecting electrode 470 may be located on the first interlayer insulating layer 460. The second interlayer insulating layer 480 may include a silicon compound, a metal oxide, or the like.

The second active layer 490 may be located on the second interlayer insulating layer 480. The second active layer 490 may include an inorganic semiconductor (e.g., polysilicon, etc.). The second active layer 490 may include a second channel area 495 having a second length "b" that is shorter than the first length "a". In embodiments, the second channel area 495 may be doped with a group 5 element. When the second pixel switching transistor SW_TFT2 is a PMOS transistor, the second channel area 495 may be doped with the group 5 element. In embodiments, when the second pixel switching transistor SW_TFT2 is an NMOS transistor, the second channel area 495 may be doped with the group 3 element.

The first channel area 435 may have the first length "a" relatively longer than the second length "b" to secure a driving voltage and improve afterimages. The second channel area 495 may have the second length "b" that is relatively shorter than the first length "a" to reduce charging time.

The 2-1 gate insulating layer 500 may be located on the second interlayer insulating layer 480 covering the second active layer 490. The 2-1 gate insulating layer 500 may be a single layer including silicon oxide (SiOx). The 2-2 gate insulating layer 505 may be located on the 2-1 gate insulating layer 500. The 2-2 gate insulating layer 505 may be a single layer including silicon nitride (SiNx). In embodiments, the second gate insulating layer 510 may be a multilayer including the 2-1 gate insulating layer 500 and the 2-2 gate insulating layer 505.

The second gate electrode 520 may be located on the second gate insulating layer 510. The second gate electrode 520 may overlap the second active layer 490. The second gate electrode 520 may include a metal, an alloy, a metal nitride, a conductive metal oxide, a transparent conductive material, or the like.

The third interlayer insulating layer 530 covering the second gate electrode 520 may be located on the second gate insulating layer 510. The third interlayer insulating layer 530 may include a silicon compound, a metal oxide, or the like.

The first source electrode 540a, the first drain electrode 540b, the second source electrode 540c, and the second drain electrode 540d may be located on the third interlayer insulating layer 530. The first source electrode 540a may be connected to a source area of the first active layer 430. The first drain electrode 540b may be connected to the drain area of the first active layer 430 through the connecting electrode 470. The first drain electrode 540b may be connected to the lower electrode 610. In FIG. 4, the first source electrode 540a and the first drain electrode 540b are illustrated to be located on the third interlayer insulating layer 530, but the present disclosure is not limited thereto. For example, the first source electrode 540a and the first drain electrode 540b may be located on the same layer as the second gate electrode 520. In this case, the first drain electrode 540b may be connected to the lower electrode 610 through a separate conductive pattern.

The second source electrode 540c may be connected to a source area of the second active layer 490. The second drain electrode 540d may be connected to a drain area of the second active layer 490. The first source electrode 540a, the first drain electrode 540b, the second source electrode 540c, and the second drain electrode 540d may include metal, alloy, metal nitride, conductive metal oxide, transparent conductive material, and/or the like.

The via insulating layer 550 may be located on the third interlayer insulating layer 530 covering the first source electrode 540a, the first drain electrode 540b, the second source electrode 540c, and the second drain electrode 540d. The via insulating layer 550 may include an organic material or an inorganic material.

The lower electrode 610 may be located on the via insulating layer 550. The lower electrode 610 may be connected to the first drain electrode 540b. In embodiments, the lower electrode 610 may be an anode electrode. Optionally, the lower electrode 610 may be a cathode electrode. The lower electrode 610 may include a metal, an alloy, a metal nitride, a conductive metal oxide, a transparent conductive material, or the like.

The pixel defining layer PDL may be located on the via insulating layer 550. The pixel defining layer PDL may have an opening exposing an upper surface of the lower electrode 610. The pixel defining layer PDL may be made of an organic material or an inorganic material.

The intermediate layer 620 may be located on the lower electrode 610 exposed by the pixel defining layer PDL. The intermediate layer 620 may include a light-emitting material capable of generating different color lights such as red light, green light, and blue light.

The upper electrode 630 may be located on the intermediate layer 620 and the pixel defining layer PDL. The upper electrode 630 may cover the intermediate layer 620 and the pixel defining layer PDL and may be overlap an entirety or a majority of the substrate 410. In embodiments, the upper electrode 630 may be a cathode electrode. Optionally, the upper electrode 630 may be an anode electrode. The upper electrode 630 may include a metal, an alloy, a metal nitride, a conductive metal oxide, a transparent conductive material, or the like.

As described above, the second pixel switching transistor SW_TFT2 is located above the second pixel driving transistor DR_TFT2, so that the second pixel switching transistor SW_TFT2 overlaps at least partially with the second pixel driving transistor DR_TFT2. Through this, the dead space of the display device 100 may be reduced.

Figure 5:
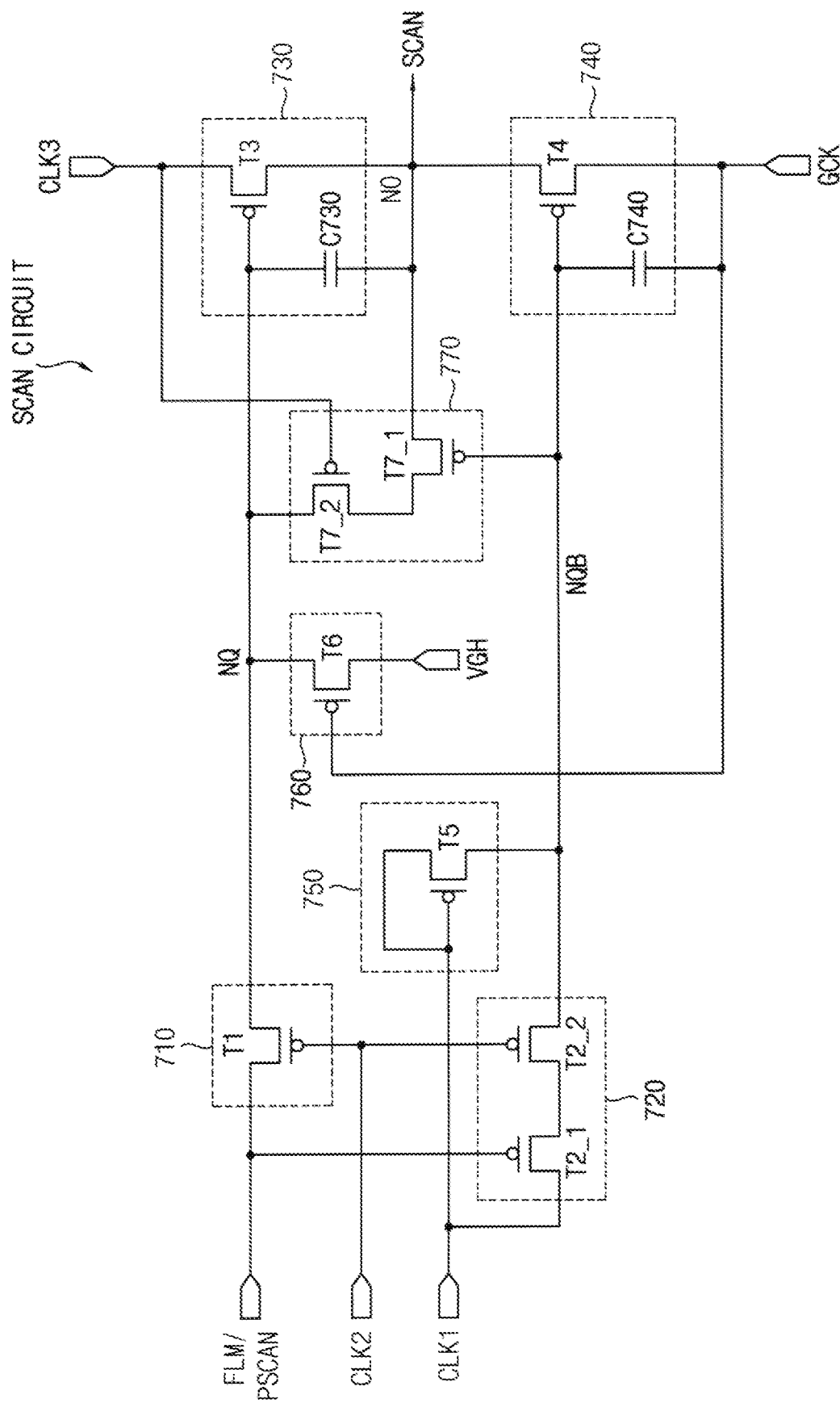
FIG. 5 is a circuit diagram illustrating some embodiments of a scan circuit located in a scan driver of FIG. 1.

FIG. 5 is a circuit diagram illustrating some embodiments of a scan circuit located in a scan driver of FIG. 1.

Referring to FIGS. 1 and 5, The scan driver 140 according to embodiments of the present disclosure may include a plurality of stages, and each of the stages may include a scan circuit. The scan circuit may include a first input part 710, a second input part 720, a first output part 730, and a second output part 740. In some embodiments, the scan circuit may further include a holding part 750, a simultaneous driving control part 760, and a stabilizing part 770.

The first input part 710 may transmit an input signal to a set node NQ in response to the second clock signal CLK2. For example, the first input part 710 of the first stage of the scan driver 140 receives a start signal FLM as the input signal, and the other stages receive a previous scan signal PSCAN as the input signal. In embodiments, the first input part 710 may include a first input terminal including a gate terminal receiving the second clock signal CLK2, a first terminal receiving the input signal FLM/PSCAN, and a second terminal connected to the set node NQ.

The second input part 720 may transmit a first clock signal CLK1 to a reset node NQB in response to the input signal and the second clock signal CLK2. For example, when the input signal and the second clock signal CLK2 have an active level, the second input part 720 may transmit the first clock signal CLK1 having an inactive level to the reset node NQB.

In embodiments, the second input part 720 may include a second input transistor T2_1 including a gate terminal receiving the input signal FLM/PSCAN, a first terminal receiving the first clock signal CLK1, and a second terminal, and also may include a third input transistor T2_2 including a gate terminal receiving the second clock signal CLK2, a first terminal connected to the second terminal of the second input transistor T2_1, and a second terminal connected to the reset node NQB.

The holding part 750 may maintain the voltage of the reset node NQB in response to the first clock signal CLK1. For example, when the first clock signal CLK1 has a low level, the holding part 750 may maintain the voltage of the reset node NQB at the low level. In embodiments, the holding part 750 may include a holding transistor including a gate terminal for receiving the first clock signal, a first terminal receiving the first clock signal, and a second terminal connected to the reset node NQB.

The simultaneous driving control part 760 may deactivate the first output part 730 in response to a simultaneous driving signal GCK. In embodiments, the simultaneous driving signal GCK may have a low level in the simultaneous compensation period, and a high level in the remaining period. In the simultaneous compensation period, the simultaneous driving control part 760 may transmit a high level gate-off voltage VGH to the set node NQ in response to the low level simultaneous driving signal GCK. The first output part 730 may be deactivated by the gate-off voltage VGH of the set node NQ. In embodiments, the simultaneous driving control part 760 may include a simultaneous driving control transistor T6 including a gate terminal receiving the simultaneous driving signal GCK, a first terminal receiving the gate off voltage VGH, and a second terminal connected to the set node NQ.

The stabilizing part 770 may stabilize the scan signal SCAN in response to a voltage of the reset node NQB and the third clock signal CLK3. For example, when the voltage of the reset node NQB and the third clock signal CLK3 have a low level, the stabilizing part 770 may stabilize the scan signal SCAN to a high level. In embodiments, the stabilizing part 770 may include a second stabilizing transistor T7_2 including a gate terminal receiving the third clock signal CLK3, a first terminal connected to the set node NQ, and a second terminal, and a first stabilizing transistor T7_1 including a gate terminal connected to the reset node NQB, a first terminal connected to the second terminal of the second stabilizing transistor T7_2, and a second terminal connected to an output node NO.

The first output part 730 may output the third clock signal CLK3 as the scan signal SCAN in response to the voltage of the set node NQ. For example, in a data programming period, an input signal of a low level may be transmitted to the set node NQ in response to a pulse of the second clock signal CLK2. Subsequently, in the next pulse of the third clock signal CLK3, the voltage of the set node NQ may be boosted from the low level to a lower level by the first output capacitor C730 of the first output part 730. A first output transistor T3 of the first output part 730 may output the third clock signal CLK3 of a low level as the scan signal SCAN in response to the boosted voltage of the set node NQ. In embodiments, the first output part 730 may include the first output transistor T3 including a gate terminal connected to the set node NQ, a first terminal receiving the third clock signal CLK3, and a second terminal connected to the out node NO, and also may include the first output capacitor C730 including a first electrode connected to the set node NQ, and a second electrode connected to the output node NO.

The second output part 740 may output a simultaneous driving signal GCK as a scan signal SCAN in response to the voltage of the reset node NQB. For example, in the simultaneous compensation period, when the simultaneous driving signal GCK changes from a high level to a low level, the voltage of the reset node NQB may be boosted from the low level to a lower level by the second output capacitor C740 of the second output part 740. The second output transistor T4 of the second output part 740 may output a simultaneous driving signal GCK of low level as a scan signal SCAN in response to a boosted voltage of the reset node NQB. In embodiments, the second output part 740 may include a second output transistor T4 including a gate terminal connected to the reset node NQB, a first terminal receiving a simultaneous driving signal GCK, and a second terminal connected to the output node NO, and a second output capacitor C740 including a first electrode connected to the reset node NQB, and a second electrode receiving the simultaneous signal GCK.

The first output part 730 and the second output part 740 may be connected to a scan signal output part of the scan circuit. The first output transistor T3 and the second output transistor T4 connected to the scan signal output part may be defined as scan buffer transistors. Transistors T1, T2_1, T2_2, T5, T6, T7_1, T7_2 excluding the first and second output transistors T3 and T4 of the scan circuit may be defined as scan circuit transistors.

Figure 6:
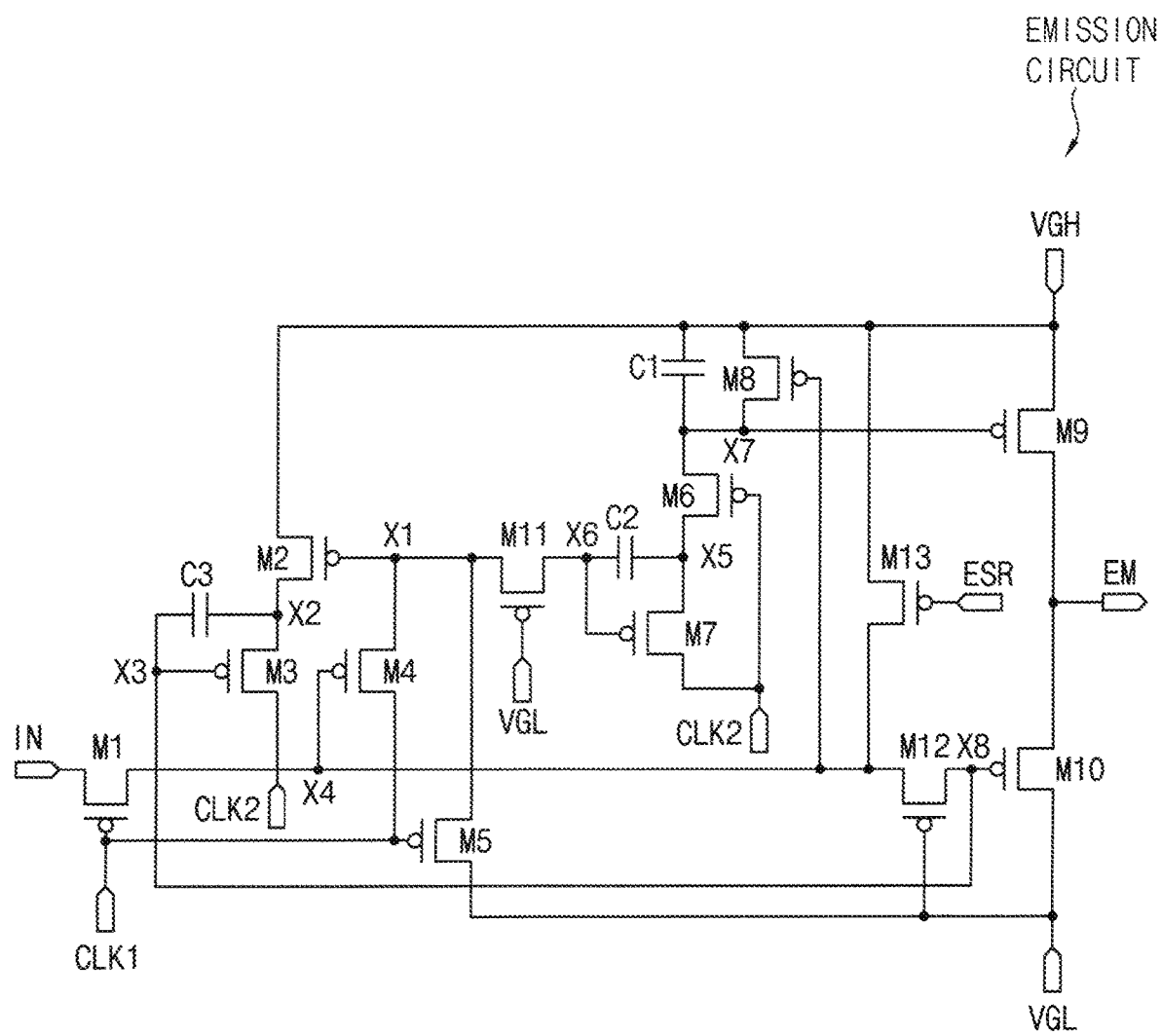
FIG. 6 is a circuit diagram illustrating some embodiments of a light emitting circuit located in a light emitting driver of FIG. 1.

FIG. 6 is a circuit diagram illustrating some embodiments of a light emitting circuit located in a light emitting driver of FIG. 1.

Referring to FIGS. 1 and 6, the light emitting driver 150 according to embodiments of the present disclosure may include a light emitting circuit. The light emitting circuit may include a plurality of transistors M1, M2, M3, M4, M5, M6, M7, M8, M9, M10, M11, M12, and M13 and a plurality of capacitors C1, C2, and C3. A plurality of signals IN, CLK1, CLK2, VGL, VGH, and ESR may be applied to the light emitting circuit, and a light emitting control signal EM may be output in response to the signals.

In embodiments, the transistors M9 and M10 connected to a light emitting control signal output part for outputting the light emitting control signal EM may be defined as light emitting buffer transistors, and other transistors except for the light emitting buffer transistor M1, M2, M3, M4, M5, M6, M7, M8, M11, M12, M13 may be defined as light emitting circuit transistors.

The light emitting circuit may output the light emitting control signal EM to the display part 110. The light emitting circuit may receive a first clock signal CLK1, a second clock signal CLK2, a protection signal ESR, a first gate power voltage VGH, and a second gate power voltage VGL, and may output a light emitting control signal EM.

The light emitting circuit may include a ninth transistor M9 connected between a first gate voltage power terminal applied with the first gate voltage power VGH, and a light emitting control signal output terminal outputting the light emitting control signal EM, and a tenth transistor M10 connected between a second gate power voltage terminal applied with the second gate power voltage VGL, and the light emitting control signal output terminal.

The light emitting circuit may further include a thirteenth transistor M13 for applying the first gate power voltage VGH to the control electrode of the tenth transistor M10 in response to the protection signal ESR.

The light emitting circuit may include a pull-down part involved in an operation of lowering the light emitting control signal EM to the second gate power voltage VGL. The pull-down part may include the first transistor M1, the second transistor M2, the third transistor M3, the tenth transistor M10, and the twelfth transistor M12.

The first transistor M1 may output a gate signal to the fourth node X4 in response to the first clock signal CLK1. A control electrode of the first transistor M1 is connected to the first clock terminal to which the first clock signal CLK1 is applied, an input electrode is connected to an input terminal IN to which the gate signal is applied, and the output electrode may be connected to the fourth node X4.

The second transistor M2 may output the first gate power voltage VGH to the second node X2 in response to the voltage of the first node X1. A control electrode of the second transistor M2 may be connected to the first node X1, an input electrode may be connected to the first gate power voltage terminal, and an output electrode may be connected to the second node X2.

The third transistor M3 may output the second clock signal CLK2 to the second node X2 in response to the voltage of the third node X3. A control electrode of the third transistor M3 may be connected to the third node X3, an input electrode may be connected to the second clock terminal to which the second clock signal CLK2 is applied, and an output electrode may be connected to the second node X2.

The tenth transistor M10 may output the second gate power voltage VGL to an output terminal that outputs the light emitting control signal EM in response to the voltage of the eighth node X8. A control electrode of the tenth transistor M10 may be connected to the eighth node X8, and an input electrode may be connected to the second gate power voltage terminal to which the second gate power voltage VGL is applied.

The twelfth transistor M12 may output the voltage of the fourth node X4 to the eighth node X8 in response to the second gate power voltage VGL. A control electrode of the twelfth transistor M12 may be connected to the second gate power voltage terminal, an input electrode may be connected to the fourth node X4, and an output electrode may be connected to the eighth node X8.

The light emitting circuit may include a pull-up part involved in an operation of raising the light emitting control signal EM to the first gate power voltage VGH. The pull-up part may include a fourth transistor M4, a fifth transistor M5, a sixth transistor M6, a seventh transistor M7, an eighth transistor M8, a ninth transistor M9, and an eleventh transistor M11.

The fourth transistor M4 may output the first clock signal CLK1 to the first node X1 in response to the voltage of the fourth node X4. The fourth transistor M4 may include a control electrode connected to the fourth node X4, an input electrode connected to the first clock terminal, and an output electrode connected to the first node X1.

The fifth transistor M5 may output the second gate power voltage VGL to the first node X1 in response to the first clock signal CLK1. The fifth transistor M5 may include a control electrode connected to the first clock terminal, an input electrode connected to the second gate power voltage terminal, and an output electrode connected to the first node X1.

The sixth transistor M6 may connect the fifth node X5 and the seventh node X7 in response to the second clock signal CLK2. The sixth transistor M6 may include a control electrode connected to the second clock terminal, an input electrode connected to the fifth node X5, and an output electrode connected to the seventh node X7.

The seventh transistor M7 may output the second clock signal CLK2 to the fifth node X5 in response to the voltage of the sixth node X6. The seventh transistor M7 may include a control electrode connected to the sixth node X6, an input electrode connected to the second clock terminal, and an output electrode connected to the fifth node X5.

The eighth transistor M8 may output the first gate power voltage VGH to the seventh node X7 in response to the voltage of the fourth node X4. The eighth transistor M8 may include a control electrode connected to the fourth node X4, an input electrode connected to the first gate power voltage terminal, and an output electrode connected to the seventh node X7.

The ninth transistor M9 may output the first gate power voltage VGH to the output terminal in response to the voltage of the seventh node X7. The ninth transistor M9 may include a control electrode connected to the seventh node X7, an input electrode connected to the first gate power voltage terminal, and an output electrode connected to the output terminal.

The eleventh transistor M11 may connect the first node X1 to the sixth node X6 in response to the second gate power voltage VGL. The eleventh transistor M11 may include a control electrode connected to the second gate power voltage terminal, an input electrode connected to the first node X1, and an output electrode connected to the sixth node X6.

The light emitting circuit may include a first capacitor C1 including a first electrode connected to the first gate power voltage terminal and a second electrode connected to the seventh node X7, a second capacitor C2 including a first electrode connected to the fifth node X5 and a second electrode connected to the sixth node X6, and a third capacitor C3 including a first electrode connected to the second node X2 and a second electrode connected to the third node X3.

The first capacitor C1 may be a stabilizing capacitor that stabilizes the voltage of the seventh node X7. The second capacitor C2 may be a boosting capacitor that sufficiently lowers the voltage of the seventh node X7 to a low level. The third capacitor C3 may be a boosting capacitor that sufficiently lowers the voltage of the eighth node X8 to a low level.

In embodiments, the thirteenth transistor M13 may be connected to the fourth node X4.

When the first clock signal CLK1 has a low level VGL while the signal of the input terminal IN is reduced to the low level VGL, the voltage of the fourth node X4 decreases to the first low level VGL, the voltage of the seventh node X7 increases to a high level VGH, and the light emitting control signal EM decreases to an intermediate level VGL+ 2|VTH|. The intermediate level VGL+2|VTH| of the light emitting control signal EM has a level that is slightly higher than the second gate power voltage VGL. 2|VTH| may be a threshold voltage of the first transistor M1 and a threshold voltage of the tenth transistor M10.

Thereafter, when the second clock signal CLK2 reaches the low level VGL, the voltage of the fourth node X4 decreases to the second low level 2VGL. In this case, the light emitting control signal EM decreases from the intermediate level VGL+2|VTH| to the low level VGL. When the intermediate level VGL+2|VTH| and the low level VGL of the emission control signal EM are applied to the display part 110, the display part 110 may be turned on.

FIG. 7 is a cross-sectional view illustrating some embodiments of transistors located in a scan driver and a light emitting driver of FIG. 1.

Referring to FIGS. 5 and 7, the display device 100 may include a substrate 810, a buffer layer 820, a first interlayer insulating layer 860, a second interlayer insulating layer 880, a third interlayer insulating layer 920, a via insulating layer 940, a buffer transistor BUF_TFT, and a circuit transistor CIRCUIT_TFT.

In embodiments, the buffer transistor BUF_TFT may be the scan buffer transistor. In this case, the buffer transistor BUF_TFT may correspond to the first and second output transistors T3, T4. A structure of the buffer transistor BUF_TFT may be substantially the same as a structure of the first pixel switching transistor SW_TFT1 of FIG. 3. The circuit transistor CIRCUIT_TFT may be the scan circuit transistor. In this case, the circuit transistor CIRCUIT_TFT may correspond to the transistors T1, T2_1, T2_2, T5, T6, T7_1, T7_2. The structure of the circuit transistor CIRCUIT_TFT may be substantially the same as a structure of the first pixel driving transistor DR_TFT1 of FIG. 3.

Referring to FIGS. 6 and 7, in embodiments, the buffer transistor BUF_TFT may be the light emitting buffer transistor. In this case, the buffer transistor BUF_TFT may be transistors M9 and M10 connected to the light emitting control signal output part. The circuit transistor CIRCUIT_TFT may be the light emitting circuit transistor. In this case, the circuit transistor CIRCUIT_TFT may correspond to the transistors M1, M2, M3, M4, M5, M6, M7, M8, M11, M12, M13.

Referring to FIG. 7, the buffer transistor BUF_TFT may include a first active layer 850, a first gate insulating layer 840, a first gate electrode 870, a first source electrode 890a, and a first drain electrode 890b. The first gate insulating layer 840 may be a multilayer including a 1-1 gate insulating layer 830 and a 1-2 gate insulating layer 835. The circuit transistor CIRCUIT_TFT may include a second active layer 910, a second gate insulating layer 900, a second gate electrode 930, a second source electrode 950a, and a second drain electrode 950b.

In embodiments, the 1-1 gate insulating layer 830 may include silicon oxide (SiOx). The 1-2 gate insulating layer 835 may include silicon nitride (SiNx). The second gate insulating layer 900 may be a single layer including silicon oxide (SiOx).

A second channel area 915 of the second active layer 910 may have the first length "a", and a first channel area 855 of the first active layer 850 may have a second length "b" that is shorter than the first length "a". Because the buffer transistor BUF_TFT includes the first channel area 855 having the relatively short second length "b", a dead space of the display device may be reduced. Because the buffer transistor BUF_TFT includes the first channel area 855 having the relatively short second length "b", the amount of current flowing through the first channel area 855 increases, so that a signal may be effectively transmitted to the display part 110. In addition, because the second active layer 910 includes the second channel area 915 having a relatively long length, the scan driver 140 and the light emitting driver 150 of FIG. 1 may be stably driven.

The display device according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims, with functional equivalents thereof to be included therein.

What is claimed is:

1. A display device comprising a pixel comprising a pixel driving transistor and a pixel switching transistor,
    wherein the pixel driving transistor comprises:
        a first active layer doped with a group 3 element, and comprising a first channel area having a first length;
        a first gate insulating layer on the first active layer, and comprising a single layer;
        a first gate electrode on the first gate insulating layer;
        a first source electrode above the first gate electrode, and connected to a source area of the first active layer; and
        a first drain electrode above the first gate electrode, and connected to a drain area of the first active layer;
    wherein the pixel switching transistor comprises:
        a second active layer doped with a group 5 element, and comprising a second channel area having a second length that is shorter than the first length;
        a second gate insulating layer on the second active layer, and comprising a multilayer comprising a 2-1 gate insulating layer, and a 2-2 gate insulating layer on the 2-1 gate insulating layer and comprising a material different from the 2-1 gate insulating layer;
        a second gate electrode on the second gate insulating layer;
        a second source electrode above the second gate electrode, and connected to a source area of the second active layer; and
        a second drain electrode above the second gate electrode, and connected to a drain area of the second active layer, and
    wherein the pixel driving transistor and the pixel switching transistor each comprise a P-MOS transistor.

2. The display device of claim 1, wherein the first gate insulating layer and the second gate insulating layer are on a same layer,
    wherein the first gate insulating layer comprises a silicon oxide-based material,
    wherein the 2-1 gate insulating layer comprises the silicon oxide-based material, and
    wherein the 2-2 gate insulating layer comprises a silicon nitride-based material.

3. The display device of claim 1, wherein the first length is about 10 um to about 30 um, and
    wherein the second length is about 1 um to about 5 um.

4. The display device of claim 1, wherein the pixel further comprises a capacitance electrode on the first gate electrode, and below the first source electrode and the first drain electrode.

5. The display device of claim 4, wherein the pixel further comprises an organic light emitting diode, and
    wherein the organic light emitting diode comprises:
        a lower electrode connected to the first drain electrode;
        an intermediate layer on the lower electrode; and
        an upper electrode on the intermediate layer.

6. The display device of claim 1, further comprising a scan driver for providing a scan signal to the pixel, and comprising a scan buffer transistor and a scan circuit transistor,
    wherein the scan circuit transistor comprises:
        a third active layer doped with a group 3 element, and comprising a third channel area having the first length;
        a third gate insulating layer on the third active layer;
        a third gate electrode on the third gate insulating layer;
        a third source electrode above the third gate electrode, and connected to a source area of the third active layer; and
        a third drain electrode above the third gate electrode, and connected to a drain area of the third active layer, and
    wherein the scan buffer transistor comprises:
        a fourth active layer doped with a group 5 element, and comprising a fourth channel area having the second length;
        a fourth gate insulating layer on the fourth active layer;
        a fourth gate electrode on the fourth gate insulating layer;
        a fourth source electrode above the fourth gate electrode, and connected to a source area of the fourth active layer; and
        a fourth drain electrode above the fourth gate electrode, and connected to a drain area of the fourth active layer.

7. The display device of claim 6, wherein the third gate insulating layer is a single layer comprising a silicon oxide-based material, and
    wherein the fourth gate insulating layer is a multilayer comprising:
        a 4-1 gate insulating layer comprising the silicon oxide-based material; and
        a 4-2 gate insulating layer on the 4-1 gate insulating layer and comprising a silicon nitride-based material.

8. The display device of claim 6, wherein the scan buffer transistor is connected to a scan signal output part of the scan driver.

9. The display device of claim 6, wherein the scan circuit transistor is on the scan buffer transistor.

10. The display device of claim 1, further comprising a light emitting driver for providing a light emitting control signal to the pixel, and comprising a light emitting buffer transistor and a light emitting circuit transistor, wherein the light emitting circuit transistor comprises:
- a fifth active layer doped with a group 3 element, and comprising a fifth channel area having the first length;
- a fifth gate insulating layer on the fifth active layer;
- a fifth gate electrode on the fifth gate insulating layer;
- a fifth source electrode above the fifth gate electrode, and connected to a source area of the fifth active layer; and
- a fifth drain electrode above the fifth gate electrode, and connected to a drain area of the fifth active layer, and wherein the light emitting buffer transistor comprises:
- a sixth active layer doped with a group 5 element, and comprising a sixth channel area having the second length;
- a sixth gate insulating layer on the sixth active layer;
- a sixth gate electrode on the sixth gate insulating layer;
- a sixth source electrode above the sixth gate electrode, and connected to a source area of the sixth active layer; and
- a sixth drain electrode above the sixth gate electrode, and connected to a drain area of the sixth active layer.

11. The display device of claim 10, wherein the fifth gate insulating layer is a single layer comprising a silicon oxide-based material, and
wherein the sixth gate insulating layer is a multilayer comprising:
- a 6-1 gate insulating layer comprising the silicon oxide-based material; and
- a 6-2 gate insulating layer on the 6-1 gate insulating layer and comprising a silicon nitride-based material.

12. The display device of claim 10, wherein the light emitting buffer transistor is connected to a light emitting control signal output part of a scan driver.

13. The display device of claim 10, wherein the light emitting circuit transistor is on the light emitting buffer transistor.

14. The display device of claim 1, wherein the pixel switching transistor is on the pixel driving transistor.

15. The display device of claim 14, wherein the first gate insulating layer is a single layer comprising a silicon oxide-based material, and
wherein the second gate insulating layer is a multilayer comprising:
- a 2-1 gate insulating layer comprising the silicon oxide-based material; and
- a 2-2 gate insulating layer on the 2-1 gate insulating layer and comprising a silicon nitride-based material.

16. The display device of claim 14, wherein at least an area of the pixel driving transistor and the pixel switching transistor overlap.

17. The display device of claim 14, wherein the pixel further comprises an organic light emitting diode, and
wherein the organic light emitting diode comprises:
- a lower electrode connected to the first drain electrode;
- an intermediate layer on the lower electrode; and
- an upper electrode on the intermediate layer.

18. The display device of claim 17, wherein the pixel driving transistor further comprises a connection electrode between the first gate electrode and the first drain electrode, and
wherein the connection electrode connects the first drain electrode and the drain area of the first active layer.

19. The display device of claim 18, wherein the connection electrode overlaps the first gate electrode.

20. A display device comprising a pixel comprising a pixel driving transistor and a pixel switching transistor,
wherein the pixel driving transistor comprises:
- a first active layer doped with a group 5 element, and comprising a first channel area having a first length;
- a first gate insulating layer on the first active layer, and comprising a single layer;
- a first gate electrode on the first gate insulating layer;
- a first source electrode above the first gate electrode, and connected to a source area of the first active layer; and
- a first drain electrode above the first gate electrode, and connected to a drain area of the first active layer, wherein the pixel switching transistor comprises:
- a second active layer doped with a group 3 element, and comprising a second channel area having a second length shorter than the first length;
- a second gate insulating layer on the second active layer, and comprising a multilayer comprising a 2-1 gate insulating layer, and a 2-2 gate insulating layer on the 2-1 gate insulating layer and comprising a material different from the 2-1 gate insulating layer;
- a second gate electrode on the second gate insulating layer;
- a second source electrode above the second gate electrode, and connected to a source area of the second active layer; and
- a second drain electrode above the second gate electrode, and connected to a drain area of the second active layer, and wherein the pixel driving transistor and the pixel switching transistor are N-MOS transistor.

* * * * *